United States Patent

Yang et al.

[11] Patent Number: 5,916,717
[45] Date of Patent: Jun. 29, 1999

[54] PROCESS UTILIZING RELATIONSHIP BETWEEN REFLECTIVITY AND RESIST THICKNESS FOR INHIBITION OF SIDE EFFECT CAUSED BY HALFTONE PHASE SHIFT MASKS

[75] Inventors: Chuen-Huei Yang, Taipei; Chang-Ming Dai, Hsinchu, both of Taiwan

[73] Assignee: Industrial Technology Research Institute, Hsinchu, Taiwan

[21] Appl. No.: 09/044,058

[22] Filed: Mar. 19, 1998

[51] Int. Cl.⁶ .................................................. G03F 9/00
[52] U.S. Cl. ................................................. 430/30
[58] Field of Search ............................... 430/5, 30

[56] References Cited

U.S. PATENT DOCUMENTS

| | | | |
|---|---|---|---|
| 4,977,330 | 12/1990 | Batchelder et al. | 250/560 |
| 5,354,632 | 10/1994 | Dao et al. | 430/5 |
| 5,556,726 | 9/1996 | Yuan | 430/30 |
| 5,633,713 | 5/1997 | Tanaka et al. | 356/355 |

*Primary Examiner*—Christopher G. Young
*Attorney, Agent, or Firm*—George O. Saile; Stephen B. Ackerman; Larry J. Prescott

[57] ABSTRACT

A method of forming and exposing a layer of resist which will minimize or eliminate side lobe effect resulting from the use of phase shifting masks or attenuating phase shifting masks in the exposed and developed layer of resist. The curve of reflectivity as a function of resist thickness, or swing curve, is calculated using the index of refraction, n, and the extinction coefficient, k, of the resist material and plotted. An optimum thickness of the resist corresponding to a relative maximum of the swing curve is chosen. The angular velocity used to spin the resist onto wafers is selected to produce the optimum thickness. Wafers having a resist layer with the optimum thickness are then prepared, exposed, and developed. The layer of resist may have a layer of anti-reflective material on the top surface of the layer of resist if desired.

30 Claims, 11 Drawing Sheets

PROCESS UTILIZING RELATIONSHIP BETWEEN REFLECTIVITY AND RESIST THICKNESS FOR INHIBITION OF SIDE EFFECT CAUSED BY HALFTONE PHASE SHIFT MASKS

BACKGROUND OF THE INVENTION +ps (b 1)

Field of the Invention

This invention relates to a method of optimizing the thickness of a layer of resist in order to minimize or eliminate the side lobe effect, and more particularly to selecting the thickness of a layer of resist corresponding to a relative maximum of the curve of reflectivity as a function of resist thickness.

(2) Description of the Related Art

This invention describes a resist process to adjust the thickness of the resist layer to minimize or eliminate side lobe effect by choosing the resist thickness resulting in the lowest light intensity at the resist surface.

U.S. Pat. No. 5,354,632 to Dao et al. describes a phase shifting reticle having at least one first, second, and third areas. The transmittance of the second area is less than the transmittance of the first area. The second area provides a 180° phase shift. The third area is substantially opaque.

U.S. Pat. No. 5,633,713 to Tanaka et al. describes a system and method for measuring the distribution of absorption light amount in photoresist.

U.S. Pat. No. 5,556,726 to Yuan describes a method to determine exposure dosage without knowledge of underlying film thickness and refractive index and handle either resist thickness change or underlying film thickness/refractive index change or both.

U.S. Pat. No. 4,977,330 to Batchelder et al. describes an in-line photoresist thickness measuring device.

SUMMARY OF THE INVENTION

In the formation of photomasks used to expose a layer of photoresist on an integrated circuit wafer phase shifting material or attenuating phase shifting material is often used in applications where dimensions are very small and high resolution is required. In some applications, such as the formation of contact holes on a very fine grid, the use of phase shifting materials or attenuating phase shifting materials, which would be advantageous in other respects, results in problems due to side lobe effect.

The problem of side lobe effect can be readily seen with reference to FIGS. 1–11. FIG. 1 shows a schematic diagram of a projection system used for photolithographic processing. The system comprises a light source 10 producing a beam of light 20, such as an i line light source producing light having a wavelength of 365 nanometers, which impinges on a condensing lens 12. The light 22 passing through the condensing lens 12 illuminates a mask 14 having a pattern which is to be transferred to a layer of resist formed on an integrated circuit wafer. The light 24 passing through the mask 14 is focussed by a focussing lens 16. The light 26 passing through the focussing lens 16 forms a image of the mask pattern on an integrated circuit wafer 18 having a layer of resist formed thereon.

The integrated circuit wafers 18 having the layer of resist exposed by the projection system shown in FIG. 1 are shown in FIGS. 2A and 2B. FIG. 2A shows a wafer 70, having devices formed therein, not shown, with a layer of resist 64, having a top surface 66, formed on the top surface 68 of the wafer 70. As shown in FIG. 2B, it is frequently advantageous to form a layer of anti-reflective material 65 on the top surface 66 of the layer of resist 64.

Examples of the masks used to expose the layer of resist and the light patterns exiting the masks are shown in FIGS. 3–8. FIG. 3 shows a cross section view of a mask comprising a pattern formed of opaque material 32 and phase shifting material 34 on a transparent mask substrate 30. The photomask is illuminated by the light 22 passing through the condensing lens 12, see FIG. 1. FIG. 4 shows the electric field of the light 24, see FIG. 1, as it exits the photomask, showing the electric field 36 of the light which has not been shifted in phase and the electric field 38 of the light which has been shifted in phase by 180°. FIG. 5 shows the intensity of the light 26, see FIG. 1, at the wafer showing the intensity peak 40 which is to expose the photoresist on the wafer, in order to form a photoresist mask to form contact holes, and two side lobes 42 which are a result of the light passing through the phase shifting portion of the photomask.

FIG. 6 shows a cross section view of a mask comprising a pattern formed of attenuating phase shifting material 33 on a transparent mask substrate 31. The photomask is illuminated by the light 22 passing through the condensing lens 12, see FIG. 1. FIG. 7 shows the electric field of the light 24, see FIG. 1, as it exits the photomask, showing the electric field 37 of the light which has not been either attenuated or shifted in phase and the electric field 39 of the light which has been both attenuated and shifted in phase by 180°. FIG. 8 shows the intensity of the light 26, see FIG. 1, at the wafer showing the intensity peak 41 which is to expose the photoresist on the wafer, in order to form a photoresist mask to form contact holes, and two side lobes 43 which are a result of the light passing through the attenuating phase shifting portion of the photomask.

The side lobes described above cause problems in the exposure of the layer of resist as shown in FIGS. 9–11. FIG. 9 shows a top view of a wafer with a layer of resist 64 formed on the top surface of the wafer. When the layer of resist 64 is exposed not only the resist at the intended location of the contact holes 60 is exposed but also a part of the resist 62 at the location of the side lobes is also exposed. FIG. 10 shows a cross section of the wafer of FIG. 9 along line 10-10' of FIG. 9 showing the contact holes 60 formed in the layer of exposed and developed resist 64 on the wafer 70. FIG. 11 shows a cross section of the wafer of FIG. 9 along line 11-11' of FIG. 9 showing the defects 62 in the layer of exposed and developed resist 64 on the wafer 70 caused by the side lobes.

It is a principle objective of this invention to provide a method of forming a layer of photoresist which will avoid the problems of side lobe effect.

It is another principle objective of this invention to provide a method of forming a layer of photoresist having a layer of anti-reflective material formed on the layer of photoresist which will avoid the problems of side lobe effect.

It is another principle objective of this invention to provide a method of exposing a layer of photoresist which will avoid the problems of side lobe effect.

It is another principle objective of this invention to provide a method of exposing a layer of photoresist having a layer of anti-reflective material formed on the layer of photoresist which will avoid the problems of side lobe effect.

These objectives are achieved by adjusting the thickness of the layer of photoresist to minimize the intensity of the light used to expose the photoresist at the surface of the photoresist. This is possible because the light used to expose the photoresist sets up a standing wave within the photoresist. By minimizing the light intensity at the surface of the photoresist the problem of the side lobe effect is reduced or eliminated.

DESCRIPTION OF THE PREFERRED EMBODIMENTS

Figure 2A:
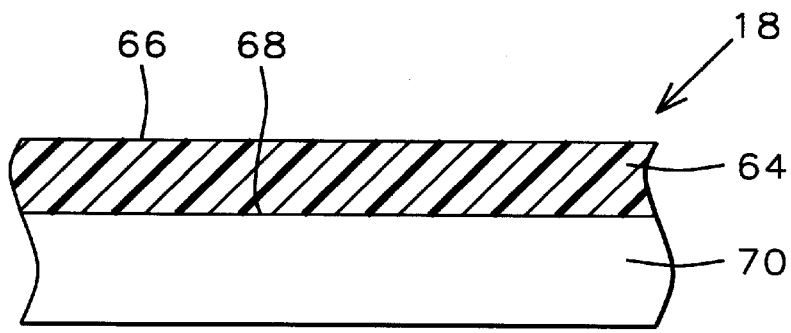
FIG. 2A shows a cross section view of an integrated circuit wafer having a layer of resist formed thereon.
Figure 2B:
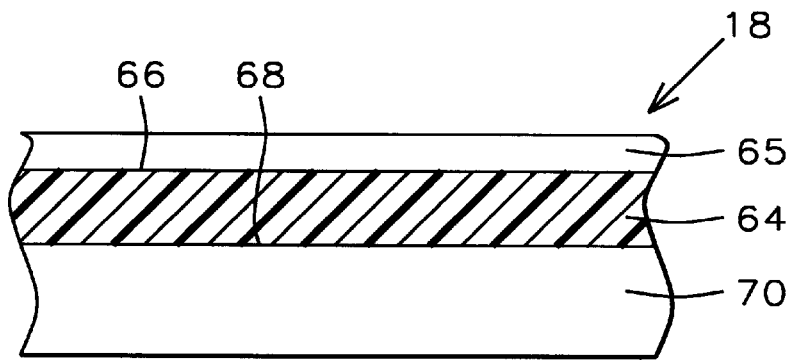
FIG. 2B shows a cross section view of an integrated circuit wafer having a layer of resist formed thereon and a layer of anti-reflective material formed on the layer of resist.
Figure 3:
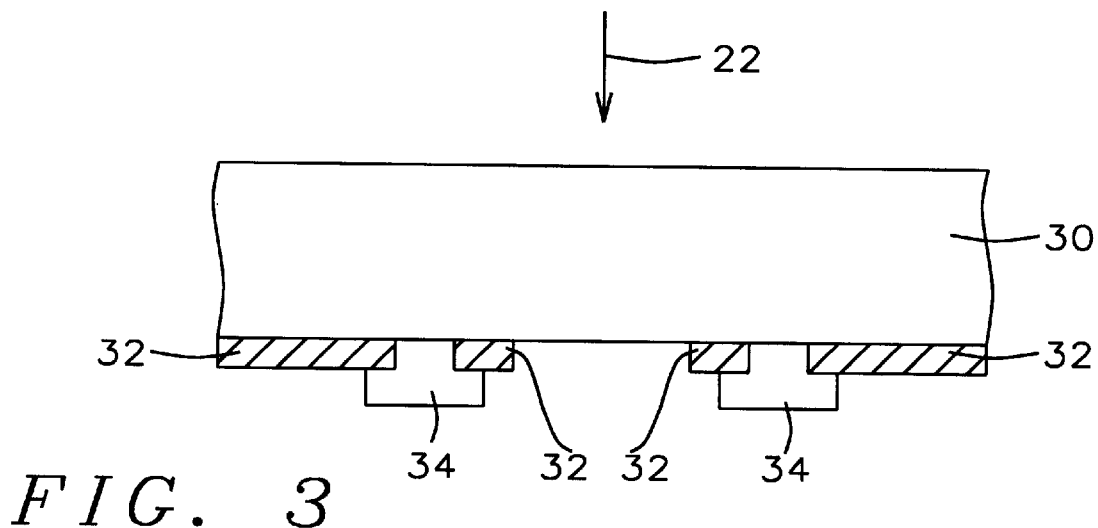
FIG. 3 shows a cross section view of a mask having a pattern formed of opaque material and phase shifting material formed on a transparent mask substrate.
Figure 4:
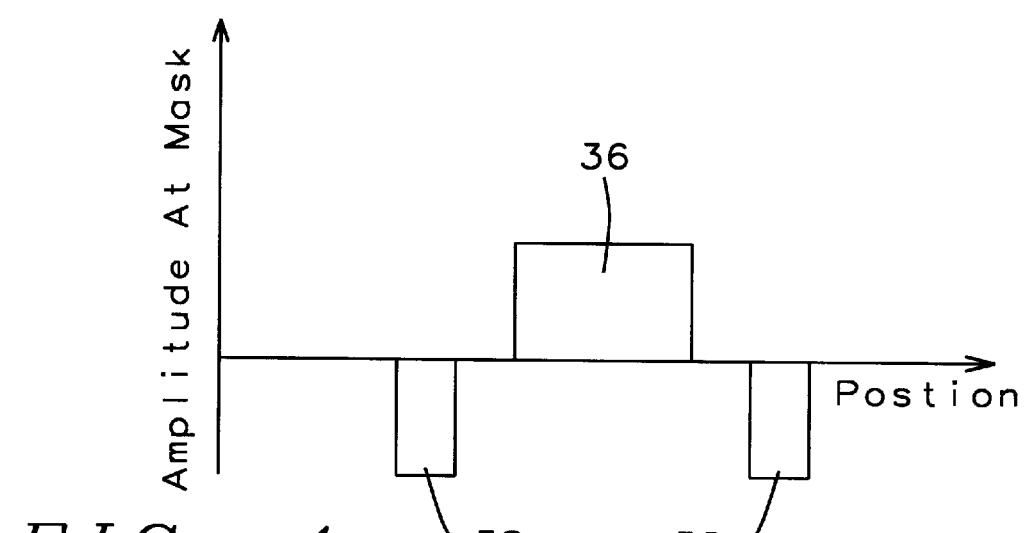
FIG. 4 shows the electric field at the mask of the light passing through the mask of FIG. 3.
Figure 5:
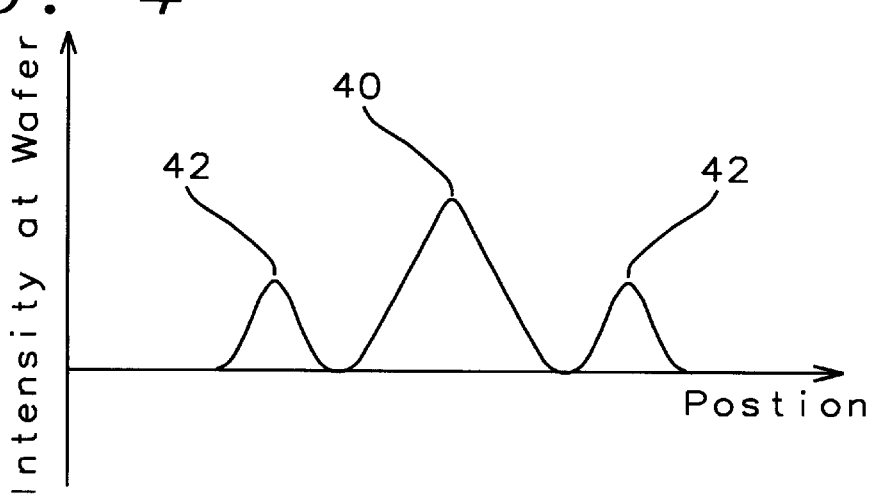
FIG. 5 shows the light intensity at the integrated circuit wafer of the light passing through the mask of FIG. 3.
Figure 6:
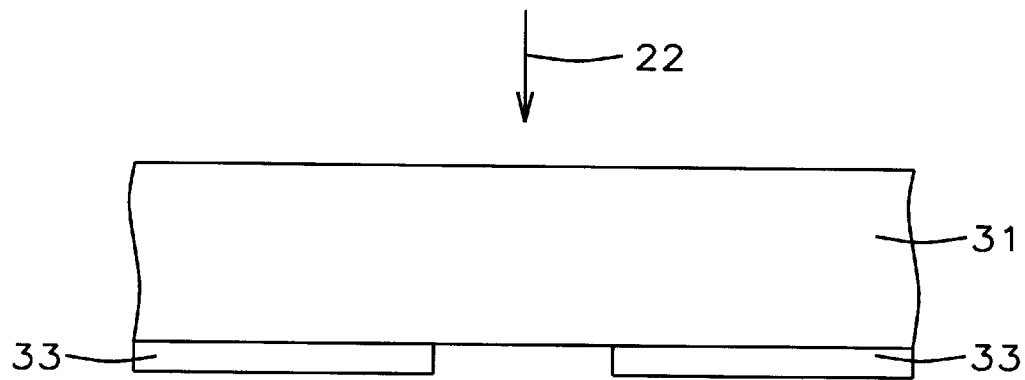
FIG. 6 shows a cross section view of a mask having a pattern formed of attenuating phase shifting material formed on a transparent mask substrate.
Figure 7:
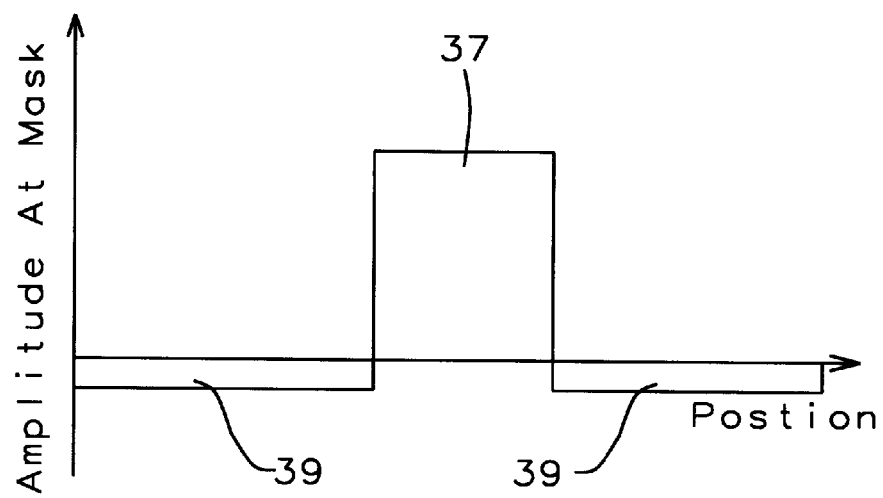
FIG. 7 shows the electric field at the mask of the light passing through the mask of FIG. 6.
Figure 8:
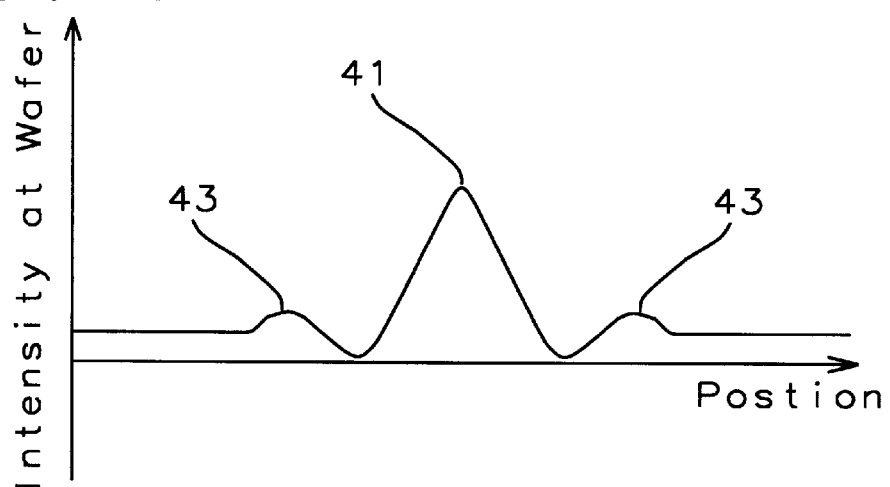
FIG. 8 shows the light intensity at the integrated circuit wafer of the light passing through the mask of FIG. 6.
Figure 9:
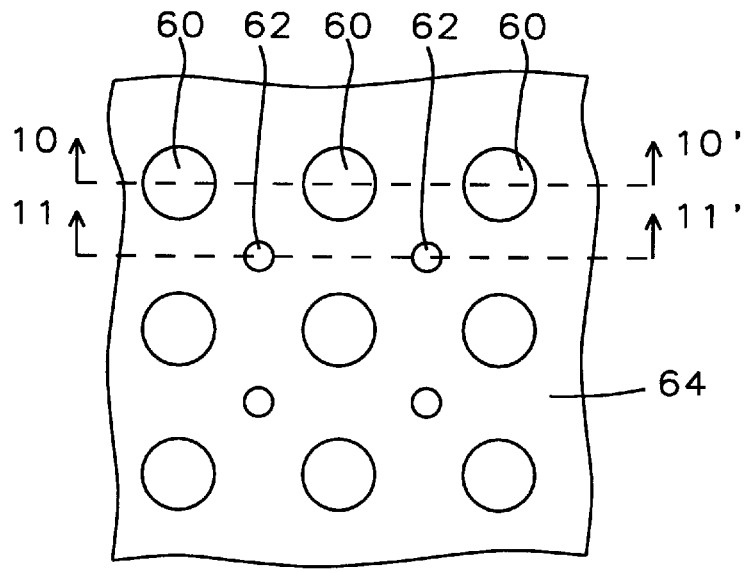
FIG. 9 shows a top view of an integrated circuit wafer having a layer of resist formed thereon after the resist has been exposed by a mask formed using either phase shifting material and opaque material or attenuating phase shifting material.
Figure 10:
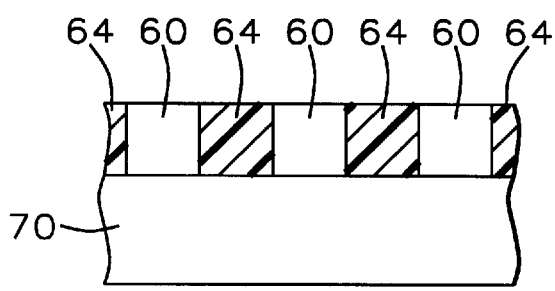
FIG. 10 shows a cross section view of the integrated circuit wafer of FIG. 9 along line 10-10' of FIG. 9.
Figure 11:
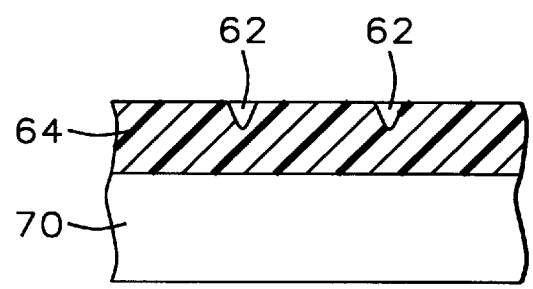
FIG. 11 shows a cross section view of the integrated circuit wafer of FIG. 9 along line 11-11' of FIG. 9 showing the problem of side lobe effect.
Figure 12:
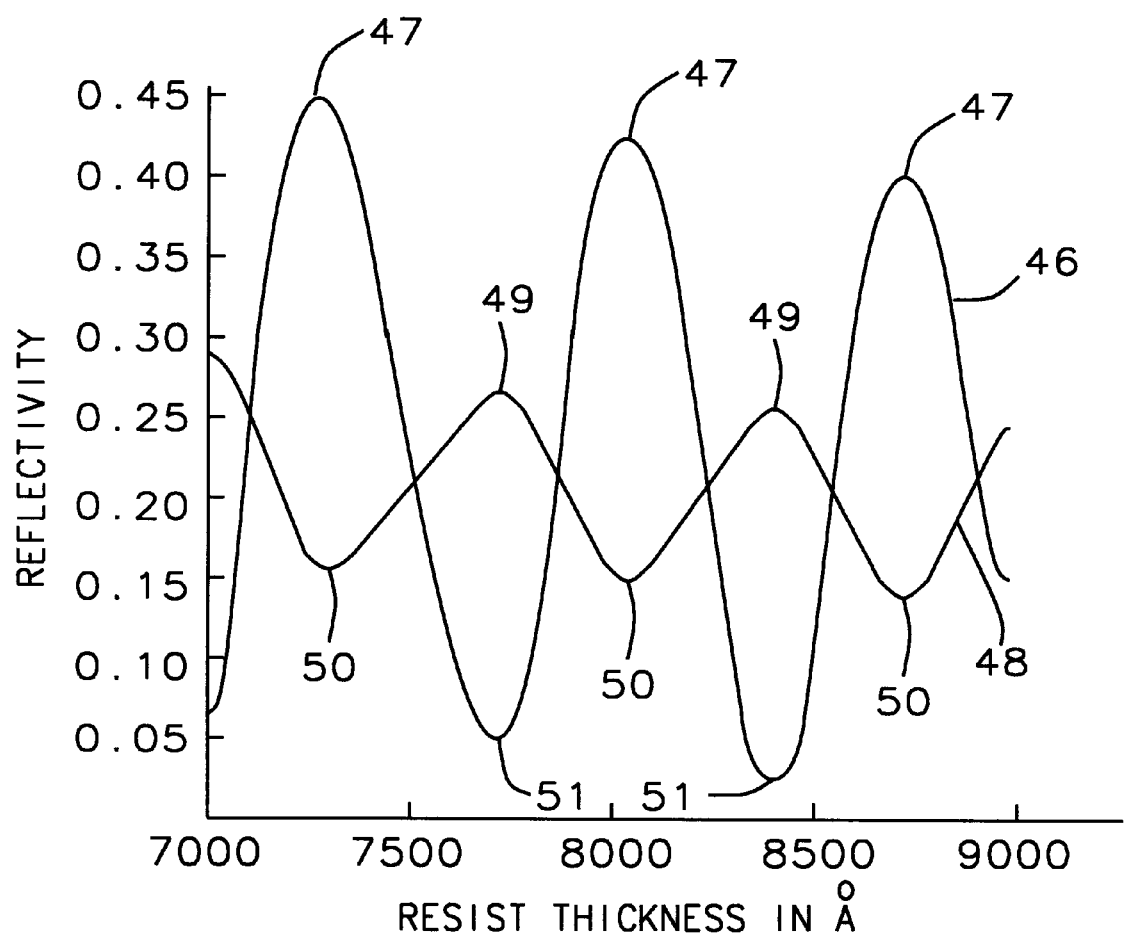
FIG. 12 shows curves of reflectivity as a function of resist thickness for a layer of resist and for a layer of resist having a layer of anti-reflective material formed thereon.

Refer now to FIGS. 12–22 for a description of the preferred embodiments of the methods of this invention of forming a resist layer and exposing the resist layer in order to minimize the problem of side lobe effect. FIG. 12 shows curves of reflectivity of a layer of resist as a function of resist thickness at a particular wavelength. The curves show the reflectivity of a layer of resist as a function of thickness 46 of the layer of resist 64, see FIG. 2A, with no anti-reflective material formed thereon and reflectivity of a layer of resist as a function of thickness 48 of the layer of resist 64 with a layer of anti-reflective material 65 formed on the top surface 66 of the layer of resist 64, see FIG. 2B. As seen in FIG. 12 the curve of reflectivity as a function of resist thickness 46, or swing curve, for the example of a layer of resist with no anti-reflective material formed thereon has relative maximum points 47, where small increases or decreases in the thickness of the layer of resist results in a decrease of reflectivity, and relative minimum points 51, where small increases or decreases in the thickness of the layer of resist results in an increase of reflectivity. As can also be seen in FIG. 12, the curve of reflectivity as a function of resist thickness 48, or swing curve, for the example of a layer of resist with a layer of anti-reflective material formed on the top surface of the layer of resist also has relative maximum points 49, where small increases or decreases in the thickness of the layer of resist results in a decrease of reflectivity, and relative minimum points 50, where small increases or decreases in the thickness of the layer of resist results in an increase of reflectivity.

Figure 1:
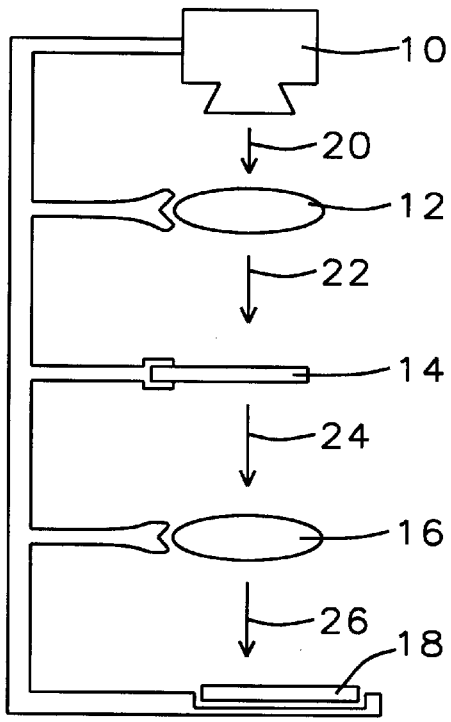
FIG. 1 shows a schematic view of a photolithographic exposure system.
Figure 13:
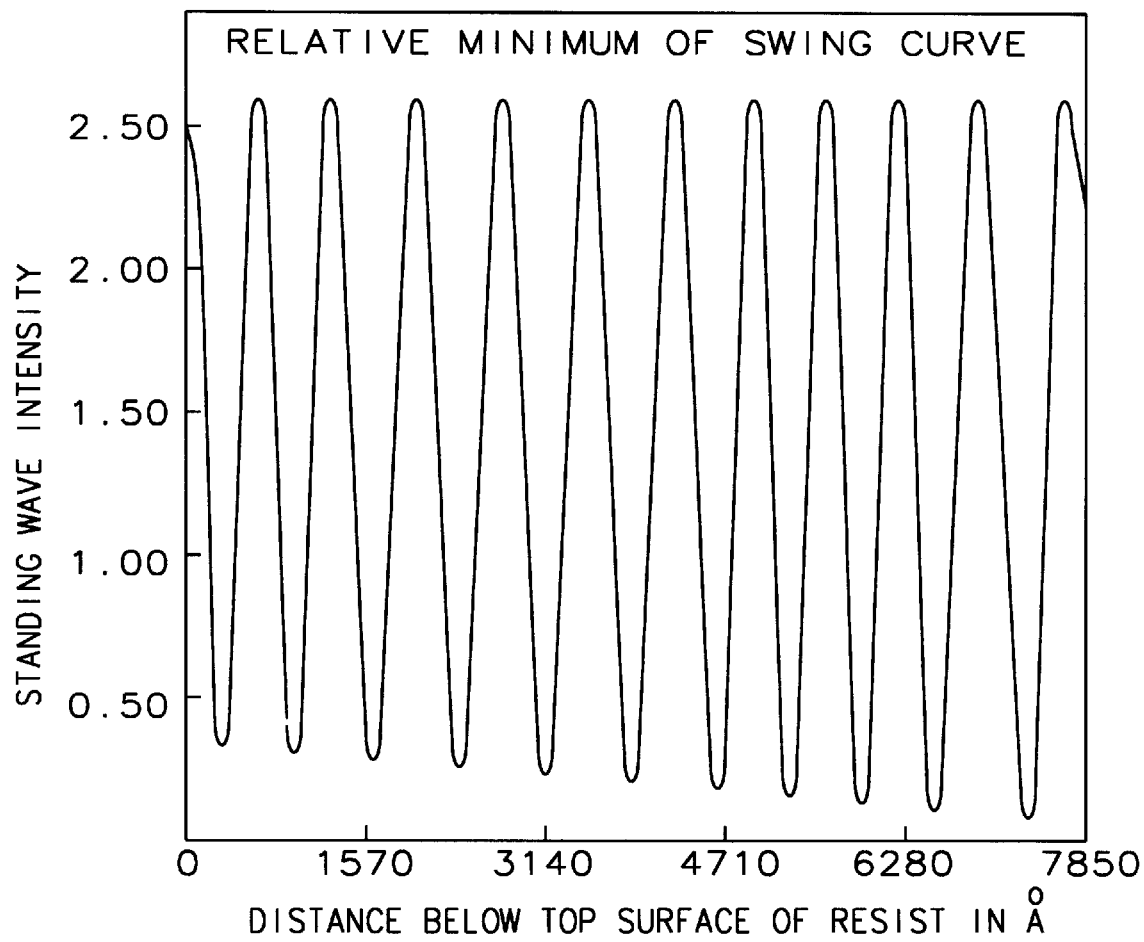
FIG. 13 shows a curve of light intensity as a function of distance below the surface of a layer of resist.
Figure 14:
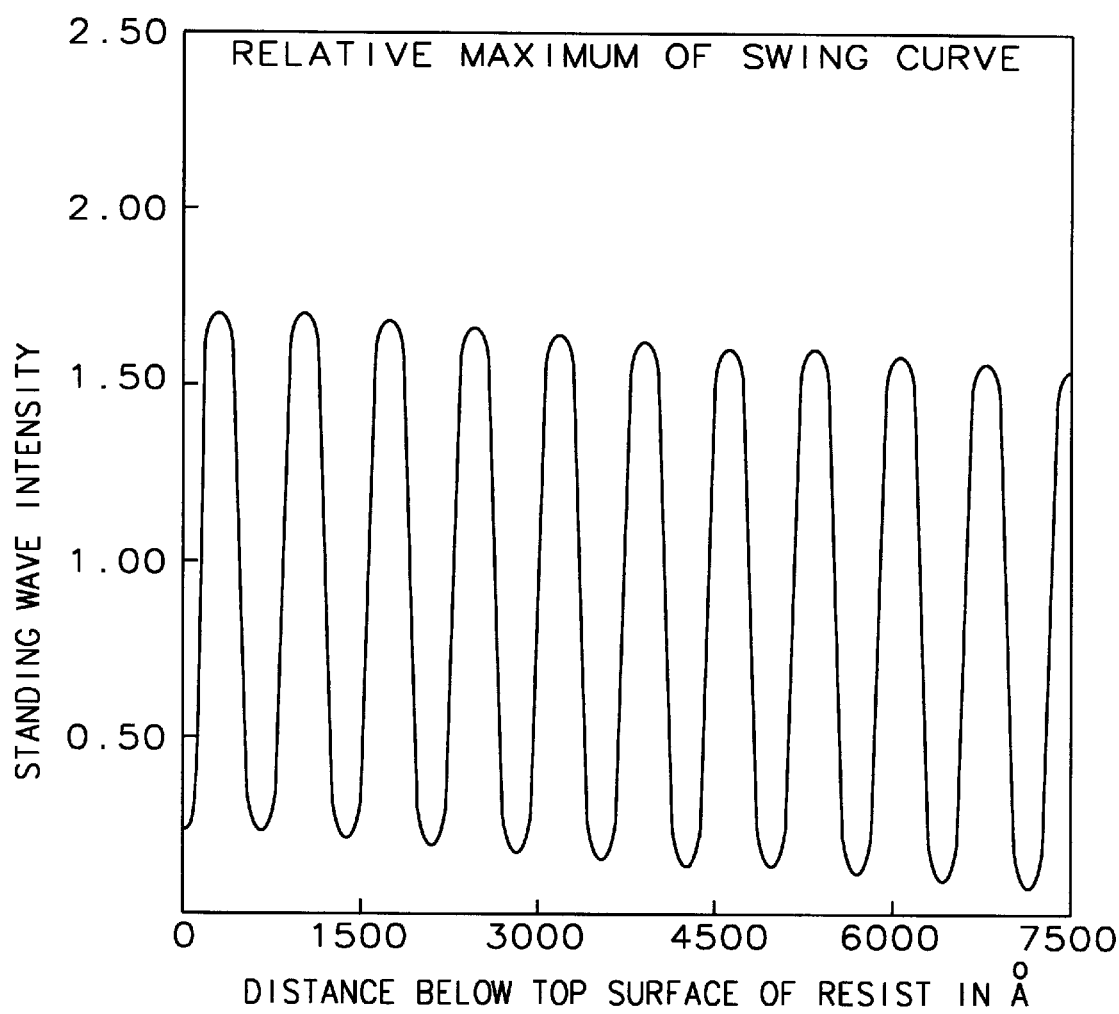
FIG. 14 shows a curve of light intensity as a function of distance below the surface of a layer of resist for a layer of resist having a layer of anti-reflective material formed thereon.

As the layer of resist is exposed to the light 26 passing through the focussing lens 16, see FIG. 1, the light intensity forms a standing wave in the thickness of the layer of resist. The shape of this standing wave depends on the thickness of the layer of resist. FIG. 13 shows a curve of the intensity standing wave showing the light intensity as a function of distance below the top surface of a layer of resist for a layer of resist having a thickness chosen to correspond to a relative minimum of the swing curve, reference number 50 or 51 of FIG. 12. FIG. 14 shows a curve of the intensity standing wave showing the light intensity as a function of distance below the top surface of a layer of resist for a layer of resist having a thickness chosen to correspond to a relative maximum of the swing curve, reference number 47 or 49 of FIG. 12. As can be seen in FIG. 13 the light intensity 52 at the surface of a layer of resist having a thickness corresponding to a relative minimum of the swing curve is very nearly a relative maximum. As can be seen in FIG. 14 the light intensity 56 at the surface of a layer of resist having a thickness corresponding to a relative maximum of the swing curve is very nearly a relative minimum.

The key part of this invention is to choose the thickness of the layer of resist on the wafer to correspond to a relative maximum of the swing curve whether or not a layer of anti-reflective material is formed on the top surface of the layer of resist. This thickness, or optimum thickness, of the layer of resist will then result in a minimum of the intensity standing wave curve at the surface of the resist layer and the side lobe effect will be minimized or avoided when the layer of resist is exposed.

Figure 15:
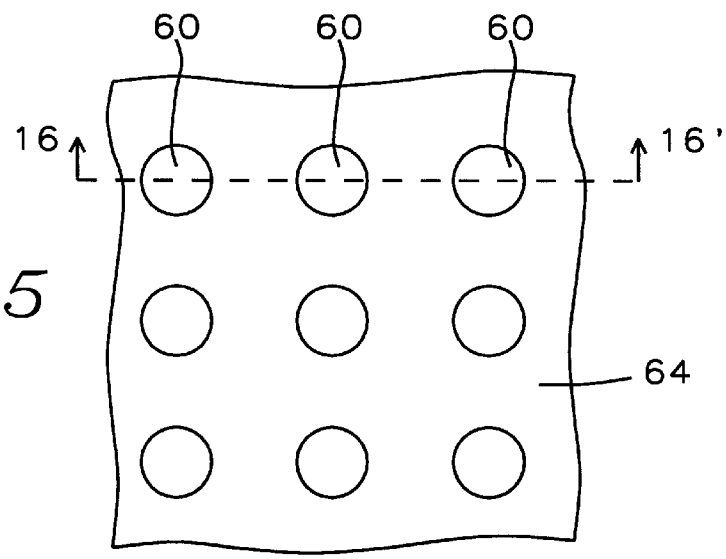
FIG. 15 shows a top view of an integrated circuit wafer having a layer of resist formed thereon after the resist has been exposed by a mask formed using either phase shifting material and opaque material or attenuating phase shifting material.
Figure 16:
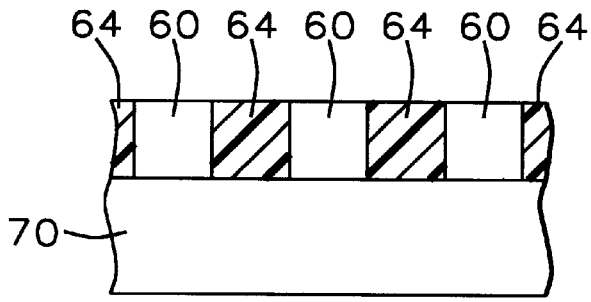
FIG. 16 shows a cross section view of the integrated circuit wafer of FIG. 15 along line 16-16' of FIG. 15.

FIG. 15 shows a top view of a wafer with a layer of resist 64 having the optimum thickness of resist, the thickness corresponding to a relative maximum of the swing curve, formed on the top surface of the wafer. When the layer of resist 64 having this optimum thickness is exposed only the resist at the intended location of the contact holes 60 is exposed. FIG. 16 shows a cross section of the wafer of FIG. 15 along line 16-16' of FIG. 15 showing the contact holes 60 formed in the layer of exposed and developed resist 64 on the wafer 70.

Figure 17:
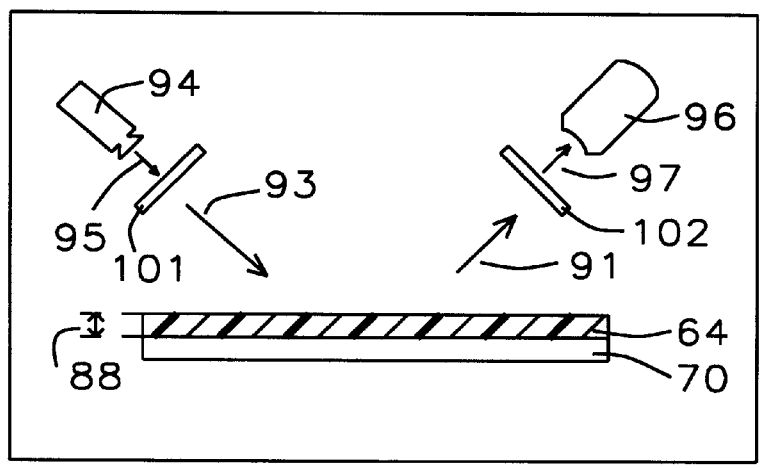
FIG. 17 shows a schematic view of a layer of resist on an integrated circuit wafer being measured by an ellipsometer.

In order to determine the optimum thickness of a layer of resist the index of refraction and the extinction coefficient of the resist material must be determined. These parameters can be determined using an ellipsometer. FIG. 17 shows a schematic view of ellipsometer comprising a collimated light source 94, a polarizer 101, an analyzer 102, and a detector 96. During the measurements the polarizer 101 is rotated. A test wafer 70 with a layer of resist 64 formed thereon is placed in the ellipsometer. The layer of resist has a thickness, d, 88. Collimated light 95 from the collimated light source 94 illuminates the rotating polarizer 101. The light 93 passing through the rotating polarizer 101 illuminates the layer of resist 64 and is reflected. The light 91 reflected from the layer of resist 64 illuminates the analyzer 102. The light 97 passing through the analyzer enters the detector 96. The rotating polarizer 101 modulates the intensity of the reflected light 91. The modulated light 97 passing through the analyzer 102 and is detected by the detector 96. Knowledge of the rotational velocity of the rotating polarizer 101 and the detection of the modulated light 97 entering the detector 96 allows the index of refraction, n, and extinction coefficient, k, of the resist material to be determined.

The index of refraction, n, and the extinction coefficient, k, are then used to calculate the reflectivity, R, as a function of resist thickness, d, for a layer of resist 64 having a thickness, d, 88 formed on a substrate 70, see FIG. 17. The reflectivity, R, is calculated using the following equations.

$$R = (a^2 + b^2 + 2ab \cos X)/(1 + a^2 b^2 + 2ab \cos X), \text{ where}$$

$$a = (n_1 - n_0)/(n_1 + n_0), b = (n_2 - n_1)/(n_2 + n_1), \text{ and}$$

$$X = 4\pi n_1 d/\lambda.$$

In these equations $\lambda$ is the wavelength of the light being reflected, d is the thickness 88 of the layer of resist, $n_0$ is the index of refraction of air, $n_1$ is the index of refraction of the layer of resist 64, and $n_2$ is the index of refraction of the substrate 70. The swing curve or the curve of reflectivity, R, as a function of resist thickness, d, can then be plotted as shown in FIG. 12.

After the swing curve has been plotted, FIG. 12, the resist thicknesses corresponding to the relative maximums, 47 or 49, are determined. The etching selectivity of the layer of resist compared to the material which is to be etched using the resist as a mask is then considered along with the resist thicknesses corresponding to the relative maximums of the swing curve to select the optimum thickness of the layer of resist.

Figure 18:
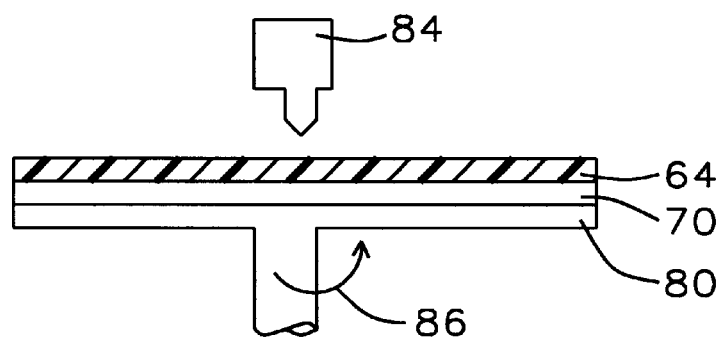
FIG. 18 shows a schematic view of a system for dispensing resist on an integrated circuit wafer.
Figure 19A:
FIG. 19A shows a cross section view of a layer of resist formed on an integrated circuit wafer.
Figure 19B:
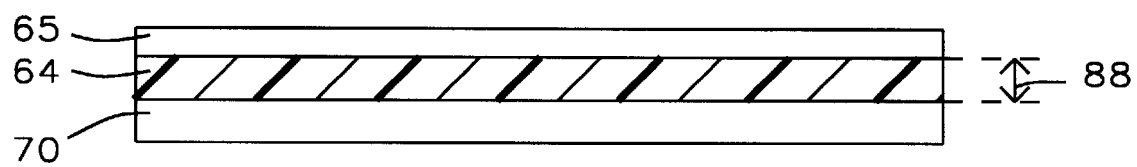
FIG. 19B shows a cross section view of a layer of resist formed on an integrated circuit wafer and a layer of anti-reflective material formed on the layer of resist.
Figure 20:
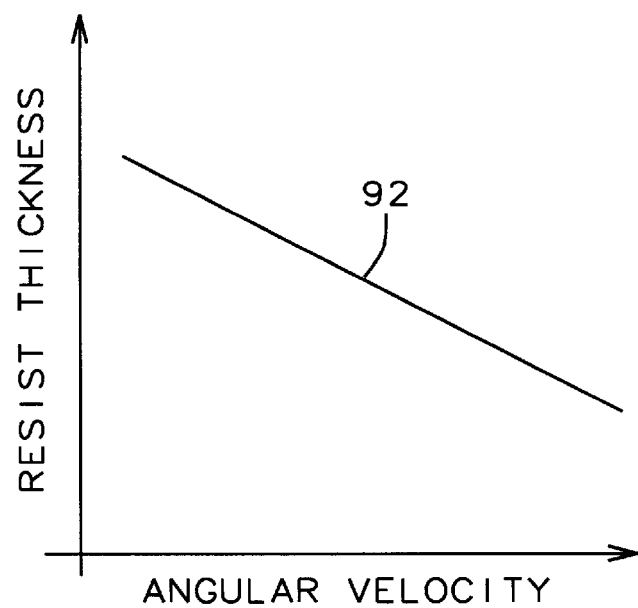
FIG. 20 shows a curve of resist thickness as a angular velocity of the system used to dispense resist on a wafer.

FIGS. 18–20 show how the optimum thickness of the layer of resist is achieved. FIG. 18 shows a schematic view of an apparatus used to spin resist on a wafer. The wafer 70 is placed in a holder 80 which spins the wafer 70 at an angular velocity 86. As the wafer 70 spins a dispenser 84 supplies resist material 64 to the top surface of the wafer 70. FIG. 19A shows a resulting layer of resist 64 having a resulting thickness 88 formed on the wafer 70. FIG. 19B shows a resulting layer of resist 64 having a resulting thickness 88 formed on the wafer 70 and a layer of anti-reflective material 65 formed on the layer of resist 64. FIG. 20 shows a curve 92 of the resulting thickness of the layer of resist as a function of the angular velocity used to spin the resist onto the wafer. As shown in FIG. 20 the resulting thickness of the layer of resist decreases as the angular velocity increases. The curve 92 of FIG. 20 is used to determine the optimum angular velocity which will result in the optimum thickness of the layer of resist.

Figure 21:
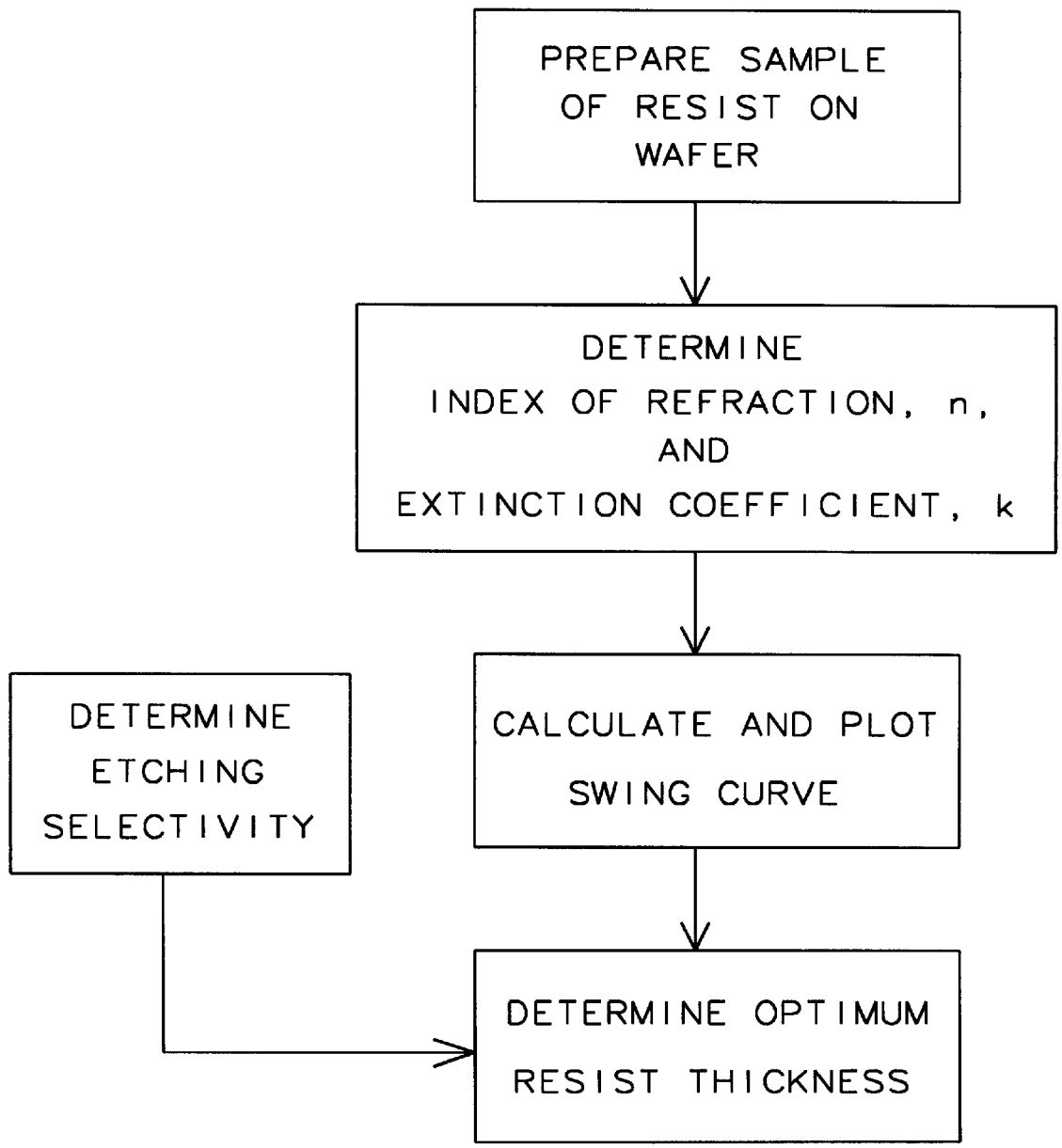
FIG. 21 shows a block diagram of the method of this invention of determining the optimum thickness of a layer of resist.
Figure 22:
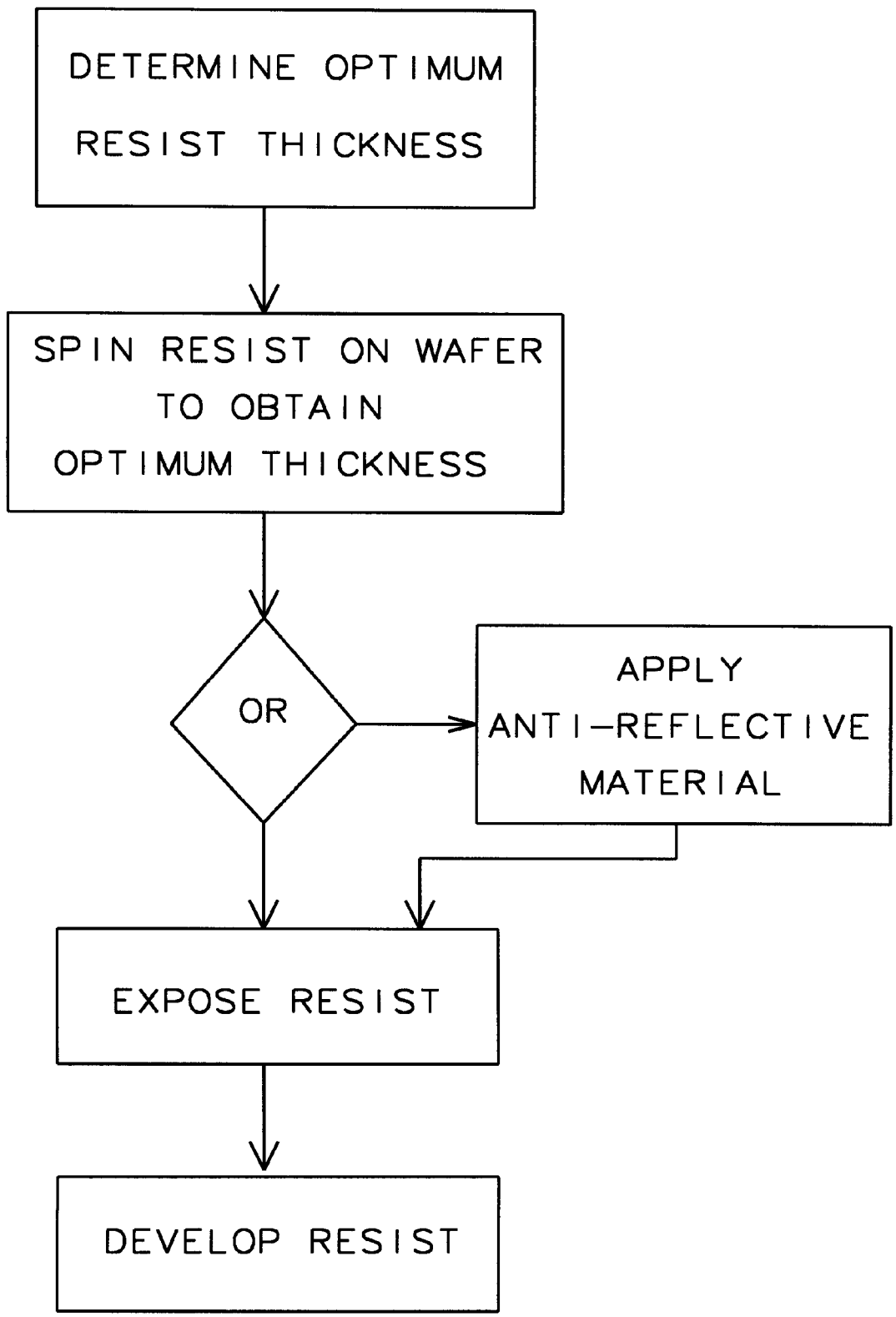
FIG. 22 shows a block diagram of the method of this invention of forming a layer of resist having optimum thickness on an integrated circuit wafer.

FIGS. 21 and 22 show block diagrams of the process flow of the methods of this invention. As shown in FIG. 21 a sample of the resist material to be used is prepared on a wafer. The index of refraction, n, and the extinction coefficient, k, of the resist material are then determined. The reflectivity as a function of resist thickness of a layer of the resist material is then calculated and the swing curve is plotted. The swing curve and the etching selectivity information are them combined to determine the optimum thickness of the layer of resist.

As shown in FIG. 22 after the optimum thickness of the layer of resist has been determined the resist is applied to the wafers to be exposed using the spin on method and the optimum angular velocity which results in the optimum thickness of resist. If desired, a layer of anti-reflective material is then applied to the resist. The layer of resist having optimum thickness, with or without a layer of anti-reflective material formed the top surface, is then exposed and developed.

While the invention has been particularly shown and described with reference to the preferred embodiments thereof, it will be understood by those skilled in the art that various changes in form and details may be made without departing from the spirit and scope of the invention.

What is claimed is:

1. A method of forming a layer of resist, comprising the steps of:
   providing a resist material;
   determining the index of refraction and the extinction coefficient of said resist material;
   determining the reflectivity as a function of thickness of a layer of said resist material;
   determining the optimum thickness of said layer of said resist material, wherein said optimum thickness corresponds to a relative maximum of said reflectivity of said layer of resist so that for small increases above or for small decreases below said optimum thickness said reflectivity of said layer of resist decreases;
   providing a substrate; and
   forming a layer of said resist material having said optimum thickness on said substrate.

2. The method of claim 1 wherein said determining said reflectivity as a function of thickness of a layer of said resist material is accomplished by calculating said reflectivity as a function of thickness of a layer of said resist material using said index of refraction and said extinction coefficient of said resist material.

3. The method of claim 1 wherein said determining said index of refraction and said extinction coefficient of said resist material is accomplished using a test substrate having a test layer of said resist material formed thereon and an ellipsometer.

4. The method of claim 1 wherein said optimum thickness of said layer of said resist material is between about 6000 and 10,000 Angstroms.

5. The method of claim 1 wherein said forming a layer of said resist material having said optimum thickness on said substrate uses a spin-on-method and an optimum angular velocity.

6. The method of claim 5 wherein said optimum angular velocity is determined by measuring the thickness as a function of angular velocity of a layer of said resist material on a test substrate.

7. The method of claim 1 wherein said substrate is an integrated circuit wafer.

8. A method of forming a layer of resist, comprising the steps of:

providing a resist material;

providing an anti-reflective material;

measuring the index of refraction and the extinction coefficient of said resist material;

determining the reflectivity as a function of thickness of a layer of said resist material having a layer of said anti-reflection material formed thereon;

determining the optimum thickness of said layer of said resist material, wherein said optimum thickness corresponds to a relative maximum of said reflectivity of said layer of resist material having a layer of said anti-reflection material formed thereon so that for small increases above or for small decreases below said optimum thickness said reflectivity of said layer of resist material having a layer of said anti-reflection material formed thereon decreases;

providing a substrate;

forming a layer of said resist material having said optimum thickness on said substrate; and forming a layer of said anti-reflective material on said layer of said resist material having said optimum thickness.

9. The method of claim 8 wherein said determining said reflectivity as a function of thickness of a layer of said resist material having a layer of anti-reflective material formed thereon is accomplished by calculation using said index of refraction and said extinction coefficient of said resist material.

10. The method of claim 8 wherein said determining said index of refraction and said extinction coefficient of said resist material is accomplished using a test substrate having a test layer of said resist material formed thereon and an ellipsometer.

11. The method of claim 8 wherein said optimum thickness of said layer of said resist material is between about 6000 and 10,000 Angstroms.

12. The method of claim 8 wherein said forming a layer of said resist material having said optimum thickness on said substrate uses a spin-on-method and an optimum angular velocity.

13. The method of claim 12 wherein said optimum angular velocity is determined by measuring the thickness as a function of angular velocity of a layer of said resist material on a test substrate.

14. The method of claim 8 wherein said substrate is an integrated circuit wafer.

15. A method of exposing a layer of resist, comprising the steps of:

providing a resist material;

determining the index of refraction and the extinction coefficient of said resist material;

determining the reflectivity as a function of thickness of a layer of said resist material;

determining the optimum thickness of said layer of said resist material, wherein said optimum thickness corresponds to a relative maximum of said reflectivity of said layer of resist so that for small increases above or for small decreases below said optimum thickness said reflectivity of said layer of resist decreases;

providing a substrate;

forming a layer of said resist material having said optimum thickness on said substrate;

providing a mask having a pattern formed thereon;

providing a projection exposure system;

exposing said layer of said resist material having said optimum thickness using said mask and said projection exposure system; and developing said layer of said resist material after exposing said layer of said resist material.

16. The method of claim 15 wherein said determining said reflectivity as a function of thickness of a layer of said resist material is accomplished by calculating said reflectivity as a function of thickness of a layer of said resist material using said index of refraction and said extinction coefficient of said resist material.

17. The method of claim 15 wherein said determining said index of refraction and said extinction coefficient of said resist material is accomplished using a test substrate having a test layer of said resist material formed thereon and an ellipsometer.

18. The method of claim 15 wherein said optimum thickness of said layer of said resist material is between about 6000 and 10,000 Angstroms.

19. The method of claim 15 wherein said forming a layer of said resist material having said optimum thickness on said substrate uses a spin-on-method and an optimum angular velocity.

20. The method of claim 19 wherein said optimum angular velocity is determined by measuring the thickness as a function of angular velocity of a layer of said resist material on a test substrate.

21. The method of claim 15 wherein said substrate is an integrated circuit wafer.

22. The method of claim 15 wherein said pattern is formed using attenuating phase shifting material.

23. A method of exposing a layer of resist, comprising the steps of:

providing a resist material;

providing an anti-reflective material;

measuring the index of refraction and the extinction coefficient of said resist material;

determining the reflectivity as a function of thickness of a layer of said resist material having a layer of said anti-reflection material formed thereon;

determining the optimum thickness of said layer of said resist material, wherein said optimum thickness corresponds to a relative maximum of said reflectivity of said layer of resist material having a layer of said anti-reflection material formed thereon so that for small increases above or for small decreases below said optimum thickness said reflectivity of said layer of resist material having a layer of said anti-reflection material formed thereon decreases;

providing a substrate;

forming a layer of said resist material having said optimum thickness on said substrate;

forming a layer of said anti-reflective material on said layer of said resist material having said optimum thickness;

providing a mask having a pattern formed thereon;

providing a projection exposure system;

exposing said layer of said resist material having said optimum thickness and said layer of resist material formed thereon using said mask and said projection exposure system; and developing said layer of said resist material after exposing said layer of said resist material.

24. The method of claim 23 wherein said determining said reflectivity as a function of thickness of a layer of said resist material having a layer of anti-reflective material formed thereon is accomplished by calculation using said index of refraction and said extinction coefficient of said resist material.

25. The method of claim 23 wherein said determining said index of refraction and said extinction coefficient of said resist material is accomplished using a test substrate having a test layer of said resist material formed thereon and an ellipsometer.

26. The method of claim 23 wherein said optimum thickness of said layer of said resist material is between about 6000 and 10,000 Angstroms.

27. The method of claim 23 wherein said forming a layer of said resist material having said optimum thickness on said substrate uses a spin-on-method and an optimum angular velocity.

28. The method of claim 27 wherein said optimum angular velocity is determined by measuring the thickness as a function of angular velocity of a layer of said resist material on a test substrate.

29. The method of claim 23 wherein said substrate is an integrated circuit wafer.

30. The method of claim 23 wherein said pattern is formed using attenuating phase shifting material.

* * * * *